United States Patent
Brun et al.

(10) Patent No.: US 8,969,134 B2
(45) Date of Patent: Mar. 3, 2015

(54) LASER ABLATION TAPE FOR SOLDER INTERCONNECT FORMATION

(71) Applicant: Intel Corporation, Santa Clara, CA (US)

(72) Inventors: Xavier F. Brun, Chandler, AZ (US); Takashi Kumamoto, Tsukuba (JP); Sufi Ahmed, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/891,279

(22) Filed: May 10, 2013

(65) Prior Publication Data

US 2014/0335686 A1    Nov. 13, 2014

(51) Int. Cl.
*H01L 21/44* (2006.01)
*H01L 21/48* (2006.01)
*H01L 21/50* (2006.01)
*H01L 23/00* (2006.01)

(52) U.S. Cl.
CPC ....... *H01L 24/11* (2013.01); *H01L 2224/11632* (2013.01)
USPC ...... 438/106; 438/57; 438/141; 257/E21.006; 257/E21.007; 257/E21.053; 257/E21.189; 257/E21.304; 257/E21.347; 257/E21.499; 257/E21.508; 257/E21.517

(58) Field of Classification Search
USPC ......... 438/30, 48, 57, 91, 106, 118, 141, 142, 438/692; 257/E21.006, E21.007, E21.053, 257/E21.189, E21.304, E21.347, E21.352, 257/E21.499, E21.508, E21.517
See application file for complete search history.

(56) References Cited

U.S. PATENT DOCUMENTS

| | | | | |
|---|---|---|---|---|
| 5,519,421 | A * | 5/1996 | Barr et al. | 347/47 |
| 6,406,835 | B1 * | 6/2002 | Kang et al. | 430/320 |
| 7,813,780 | B2 * | 10/2010 | Shah et al. | 600/345 |
| 8,428,675 | B2 * | 4/2013 | McKenna | 600/323 |
| 8,700,114 | B2 * | 4/2014 | Gottlieb et al. | 600/316 |

* cited by examiner

*Primary Examiner* — David Nhu
(74) *Attorney, Agent, or Firm* — Winkle, PLLC (57) ABSTRACT

A tape capable of laser ablation may be used in the formation of microelectronic interconnects, wherein the tape may be attached to bond pads on a microelectronic device and vias may be formed by laser ablation through the tape to expose at least a portion of corresponding bond pads. The microelectronic interconnects may be formed on the bond pads within the vias, such as by solder paste printing and solder reflow. The laser ablation tape can be removed after the formation of the microelectronic interconnects.

20 Claims, 8 Drawing Sheets

LASER ABLATION TAPE FOR SOLDER INTERCONNECT FORMATION

TECHNICAL FIELD

Embodiments of the present description generally relate to the fabrication of solder interconnects of a microelectronic device, and, more specifically, to using a tape capable of laser ablation to form microelectronic interconnects.

BACKGROUND ART

The microelectronic industry is continually striving to produce ever faster and smaller microelectronic devices for use in various mobile electronic products, such as portable computers, electronic tablets, cellular phones, digital cameras, and the like. As these goals are achieved, the size of attachment structures, such as microelectronic interconnects for the microelectronic devices, and the space or pitch between these attachment structures becomes smaller. The smaller size and pitch of the attachment structures makes them more susceptible to damage from fabrication processes, which may result in reliability issues and yield loss for the microelectronic devices. Thus, there is a continual effort to improve these processes.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to using a tape capable of laser ablation to form microelectronic interconnects, wherein the tape may be attached to bond pads on a microelectronic device and vias may be formed by laser ablation through the tape to expose at least a portion of corresponding bond pads. The microelectronic interconnects may be formed on the bond pads within the vias, such as by solder paste printing and solder reflow. The laser ablation tape can be removed after the formation of the microelectronic interconnects.

Figure 1:
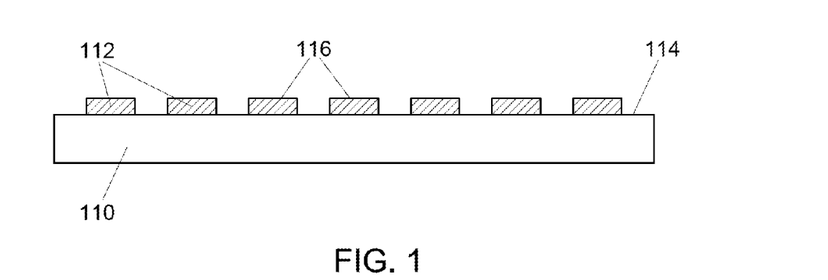
FIGS. 1, 2, and 6-9 illustrate side cross-sectional views of a method of forming at least one microelectronic interconnect on a microelectronic device, according to one embodiment of the present description.

FIGS. 1-9 illustrate methods and laser ablation tapes that may be used in the formation of microelectronic interconnects on a microelectronic device. As shown in FIG. 1, a microelectronic device 110 may be formed or provided, wherein the microelectronic device 110 includes a plurality of bond pads 112 projecting above an active surface 114 of the microelectronic device 110. The microelectronic device 110 may include a single chip device, a multi-chip device, or a microelectronic package, any of which may include a microprocessor, a chipset, a graphics device, a wireless device, a memory device, an application specific integrated circuit device, and the like. The plurality of bond pads 112 may be formed from any appropriate conductive material, such as copper, aluminum, and alloys thereof, and may be formed by any know method known in the art. It is understood that the plurality of bond pads 112 may be in electrical communication with integrated circuitry (not shown) within the microelectronic device 110.

Figure 2:
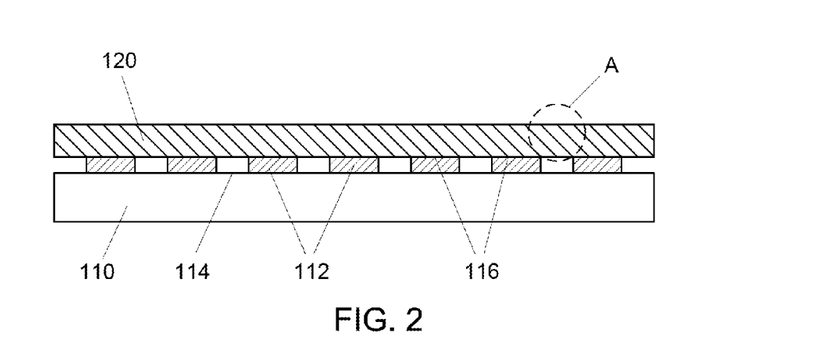
Figure 3:
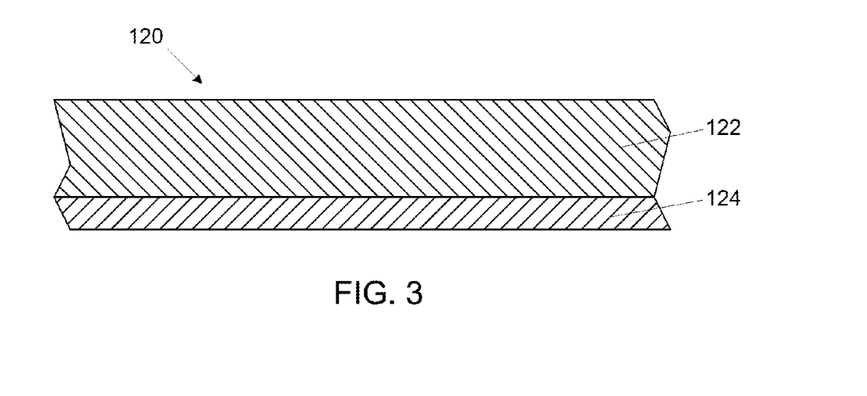
FIGS. 3-5 illustrates a side cross-sectional views of a laser ablation tape (inset A of FIG. 2), according to embodiments of the present description.

As shown in FIG. 2, a laser ablation tape 120 may be attached to an upper surface 116 of at least one of the plurality of bond pads 112 (e.g. a surface farthest from the microelectronic device 110). In one embodiment as shown in FIG. 3 (inset A of FIG. 2), the laser ablation tape 120 may be comprised of a base film 122 with an adhesive layer 124 on the base file 122, wherein the adhesive layer 124 may be adhered to the bond pad upper surface 116. A protective liner material (not shown) may be placed against the adhesive layer 124, which would be removed prior to use. The adhesive layer 124 may be any appropriate material which is capable of being ablated by a laser, including but not limited to, acrylic materials and epoxy materials. The base film 122 may comprise any appropriate material which is also capable of being ablated by a laser, including but not limited to polyimide materials. In one embodiment, the laser ablation tape 120 may be optically transparent to allow for wafer alignment using existing optical alignment systems, as will be understood by those skilled in the art.

Figure 4:
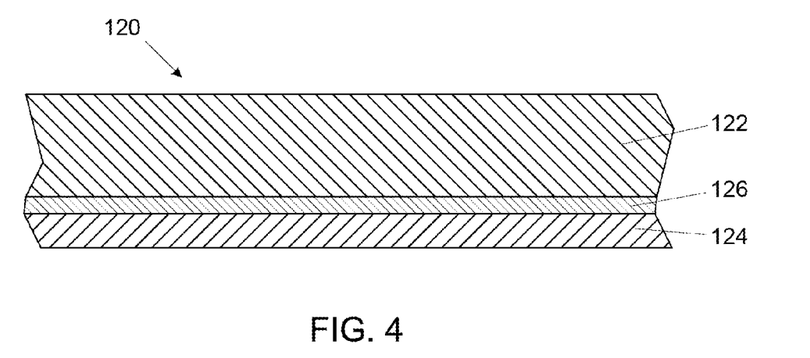

In another embodiment as shown in FIG. 4 (inset A of FIG. 2), the laser ablation tape 120 may be comprised of the base film 122, an electrostatic discharge layer 126 on the base film 122 as a mechanism for electrostatic discharge, and the adhesive layer 124 on the electrostatic discharge layer 126. The electrostatic discharge layer 126 may comprise an electrically conductive material, including but not limited to conductive polymers (such as polyaniline, polypyrole, polythiophene, polyacetylene, polyphenylene vinylene, poly 3,4,-ethylenedioxythiophene, polyphenylene sulfide, and the like) and conductive metal oxides (such as indium tin oxide and the like). As will be understood by those skilled in the art, the electrically conductive element may be grounded such that any electrostatic charge that may be built-up during attachment of the laser ablation tape 120 to the microelectronic device 110 and/or during the removing the laser ablation tape 120 from the microelectronic device 110 may be discharged. Such a means of discharge may be important, because if the electrostatic charge discharges through the microelectronic device 110, the discharge can damage the integrated circuits and/or electrical trace routes (not shown) of the microelectronic device 110.

Figure 5:
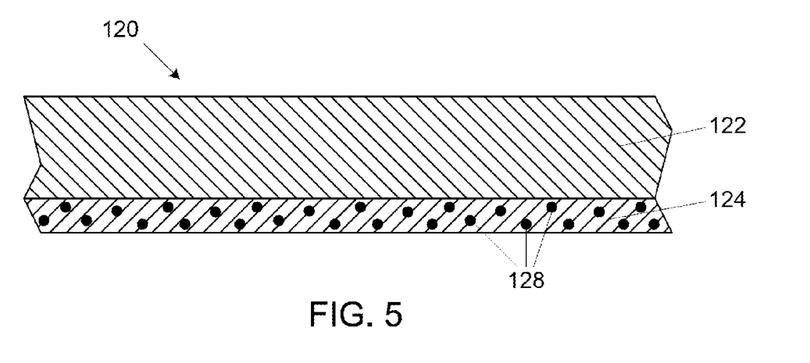

In still another embodiment of the present disclosure as shown in FIG. 5 (inset A of FIG. 2), the laser ablation tape 120 may be comprised of the base film 122 and the adhesive layer 124, wherein the adhesive layer 124 contains a conductive filler (illustrated as black circles, elements 128) dispersed therein as a mechanism for electrostatic discharge. The conductive filler 128 may comprise any appropriate conductive material in any appropriate concentration for a mechanism to render the laser ablation tape 120 substantially statically dissipative. In one embodiment, the conductive filler 128 may be a conductive polymer, including but not limited to polyaniline, polypyrole, polythiophene, polyacetylene, polyphenylene vinylene, and the like. In another embodiment, the conductive filler 128 may including but is not limited to metal coated glass, aluminum doped zinc oxide, nickel-coated graphite, indium tin oxide, silver particles, tin particles, and the like.

Figure 6:
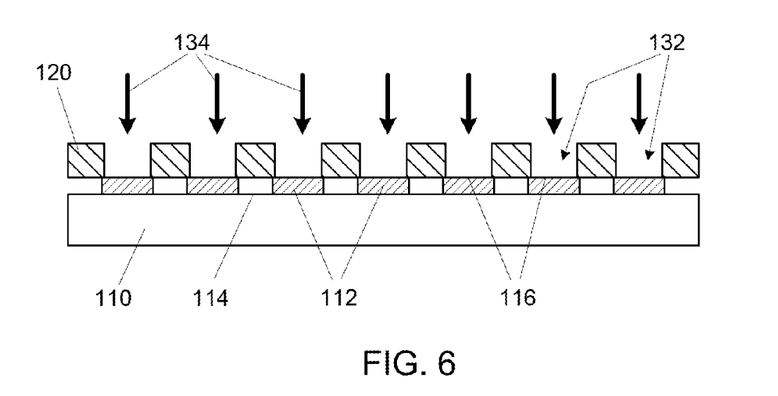

As shown in FIG. 6, at least one via 132 may be formed by laser ablation (shown generically as arrows 134) through the laser ablation tape 120 to expose at least a portion of the at least one bond pad upper surface 116. The processes and techniques of laser ablation are known in the art and for purposes of conciseness will not be discussed herein. It is understood that a photomask could used in conjunction with the laser ablation process.

Figure 7:
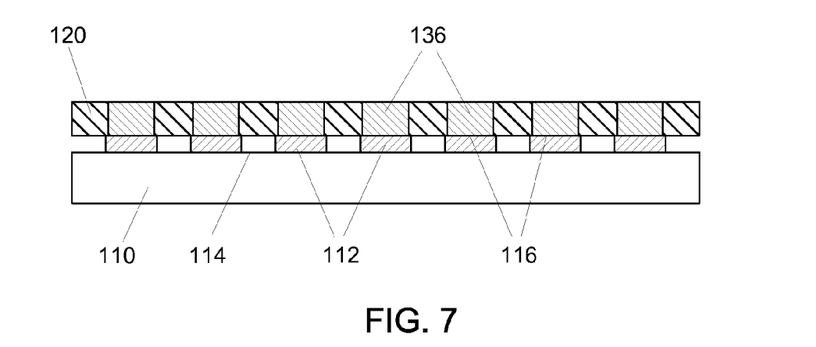

As shown in FIG. 7, a solder paste 136 may be deposited within the at least one via 132 (see FIG. 6). The solder paste 136 may be any appropriate solders materials, including but not limited to, lead/tin alloys and high tin content alloys (e.g. 90% or more tin), and similar alloys. The solder paste 136 may be deposited by any technique known in the art, including but not limited to printing techniques.

Figure 8:
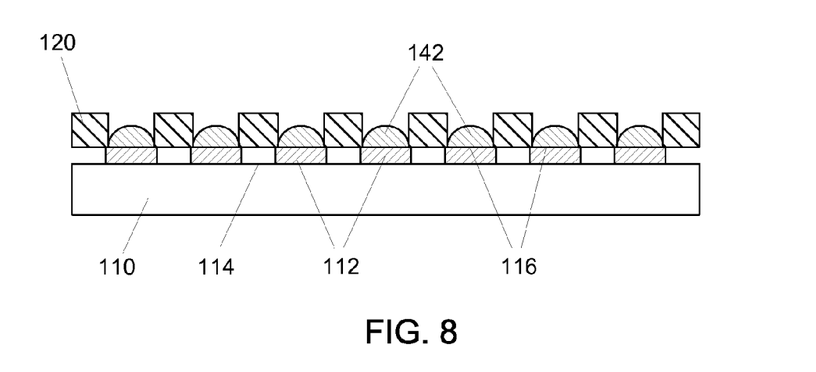
Figure 9:
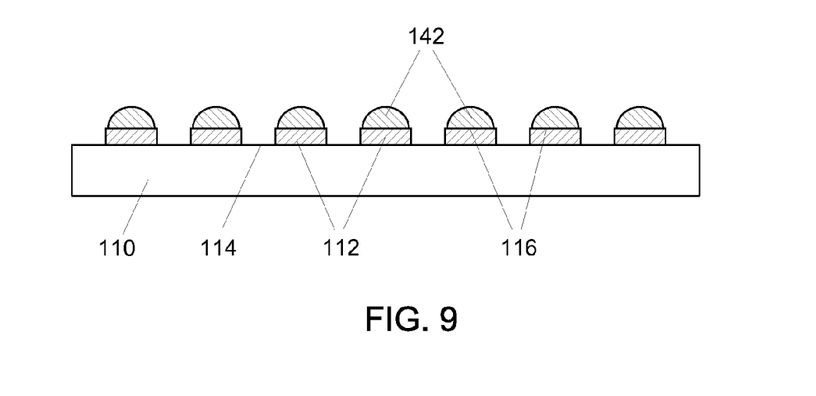

As shown in FIG. 8, the solder paste 136 of FIG. 7 may be reflowed (e.g. heated to its melting temperature) to form a microelectronic interconnect 142 on each bond pad 112 within each of the vias 132. As shown in FIG. 9, after the formation of the microelectronic interconnect 142, the laser ablation tape 120 may be removed. It is understood that the material used for the adhesive layer 124 (see FIGS. 3, 4, and 5) should be selected such that little or no adhesive residue remains after removal of the laser ablation tape 120.

Figure 10:
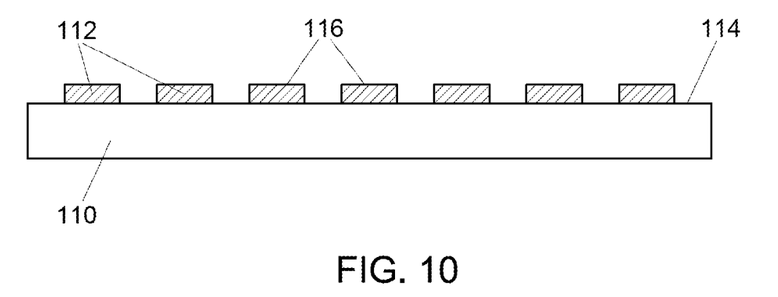
FIGS. 10-17 illustrates side cross-sectional views of a method of forming at least one microelectronic interconnect on a microelectronic device, according to another embodiment of the present description.

FIGS. 10-17 illustrate a method of forming microelectronic interconnects on a microelectronic device, according to another embodiment of the present description. As shown in FIG. 10, the microelectronic device 110 may be formed or provided, wherein the microelectronic device 110 includes a plurality of bond pads 112 projecting above the microelectronic device active surface 114.

Figure 11:
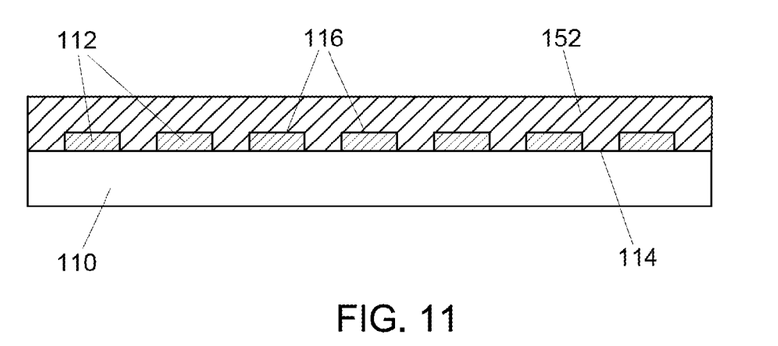

As shown in FIG. 11, an underfill material 152, such as a wafer level underfill material, may be deposited over the microelectronic device active surface 114 and the plurality of bond pads 112. The underfill material 152 may be used to prevent contamination and/or to provide structural support, as will be understood by those skilled in that art, and may be any appropriate material known in the art, such as epoxy materials.

Figure 12:
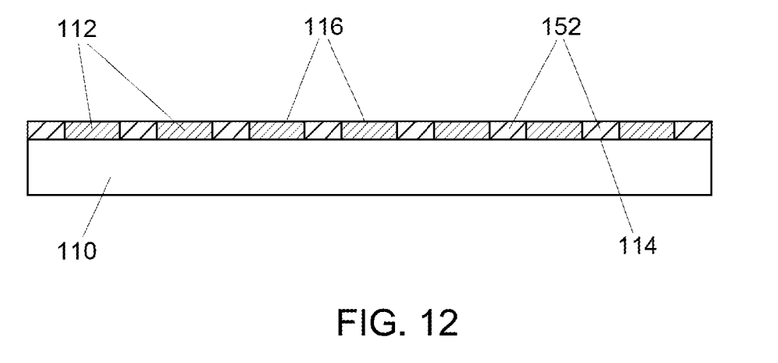

As shown in FIG. 12, a portion of the underfill material 152 may be removed to expose the bond pad upper surfaces 116, while leaving a portion of the underfill material 152 between the bond pads 112. The removal of the portion of the underfill material 152 may be achieved by any technique known in the art, including but not limited to chemical mechanical planarization/polish (CMP).

Figure 13:
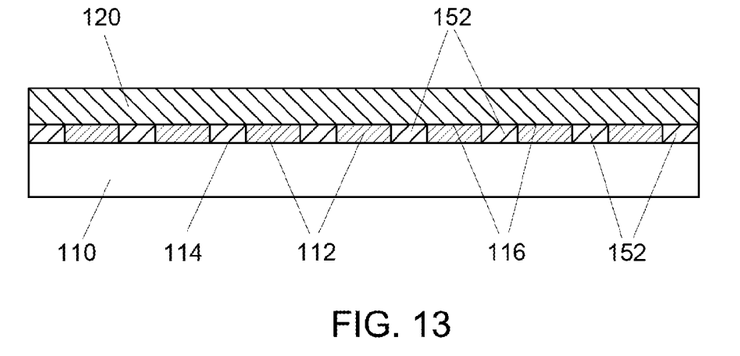
Figure 14:
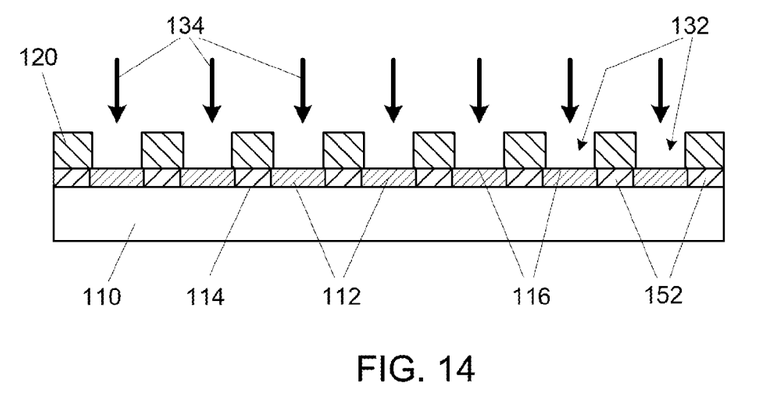
Figure 15:
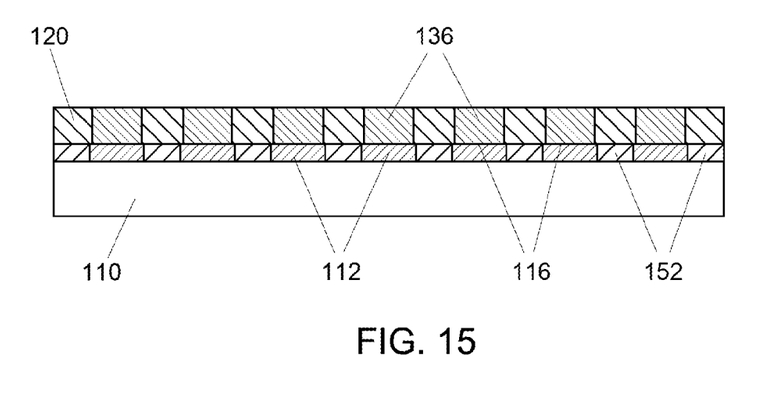
Figure 16:
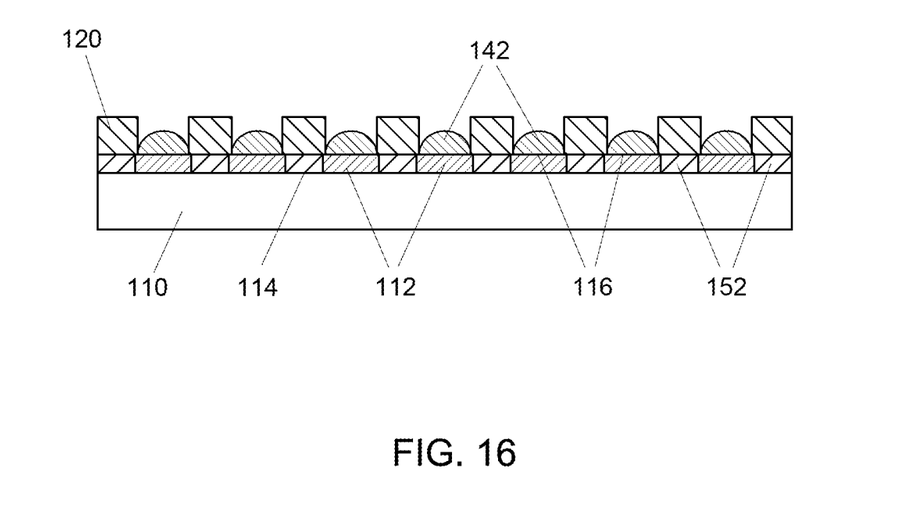
Figure 17:
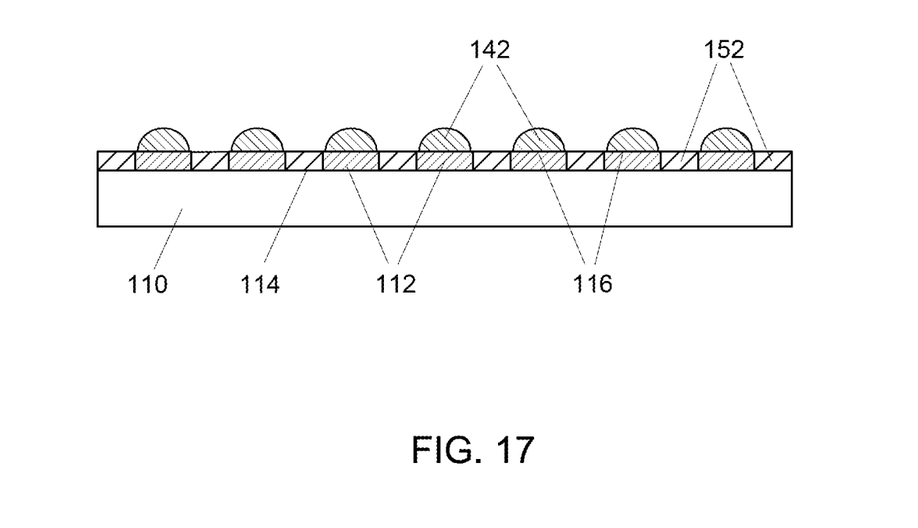

As shown in FIG. 13, the laser ablation tape 120 may be attached to the at least one bond pad upper surface 116 and the underfill material 152. As shown in FIG. 14, at least one via 132 may be formed by laser ablation 134 through the laser ablation tape 120 to expose at least a portion of the at least one bond pad upper surface 116. As shown in FIG. 15, the solder paste 136 may be deposited within the at least one via 132. As shown in FIG. 16, the solder paste 136 of FIG. 15 may be reflowed to form the microelectronic interconnect 142 on each bond pad upper surface 116 within each via 132. As shown in FIG. 17, after the formation of the microelectronic interconnect 142, the laser ablation tape 120 may be removed.

Figure 18:
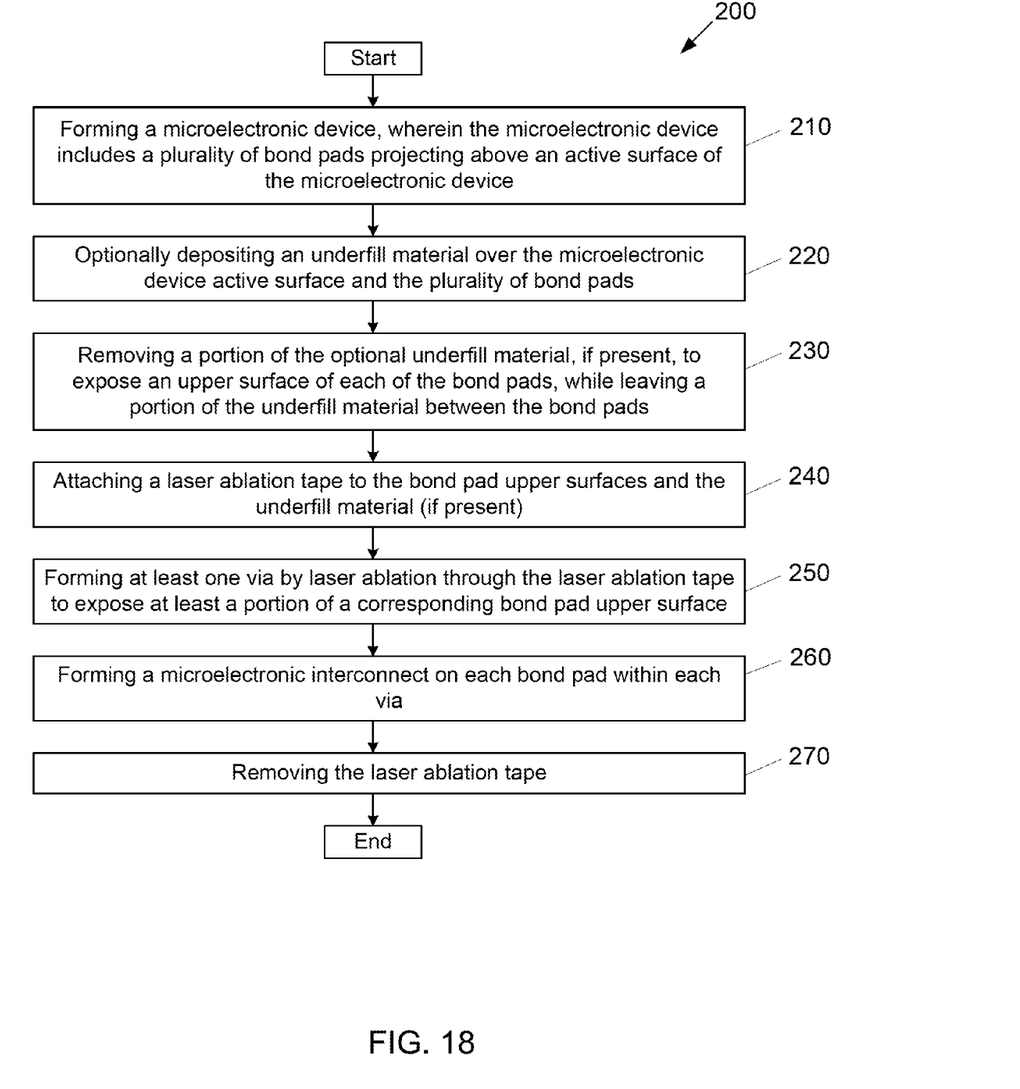
FIG. 18 is a generalized flow chart of a process of forming at least one microelectronic interconnect on a microelectronic device, according to an embodiment of the present description.

FIG. 18 is a flow chart of a process 200 of fabricating a microelectronic structure according to the various embodiments of the present description. As set forth in block 210, a microelectronic device may be formed or provided, wherein the microelectronic device includes a plurality of bond pad projecting above an active surface of the microelectronic device. An underfill material may be optionally deposited over the microelectronic device active surface and the plurality of bond pads, as set forth in block 220. As set forth in block 230, a portion of the optionally deposited underfill material, if present, may be removed to expose an upper surface of each of the plurality of bond pads, while leaving a portion of the underfill material between the bond pads. A laser ablation tape may be attached to the at least one bond pad upper surface and the underfill material (if present), as set forth in block 240. As set forth in block 250, at least one via may be formed by laser ablation through the laser ablation tape to expose at least a portion of the at least one bond pad upper surface. A microelectronic interconnect may be formed on the bond pad within the at least one via, as set forth in block 260. The laser ablation tape may then be removed, as set forth in block 270.

As will be understood by those skilled in the art, the embodiments of the present description may alleviate some issues with regard to known methods of forming microelectronic interconnects on a microelectronic device. In these known methods, rather than using the laser ablation tape of the present description, a photo-resist material is deposited over the microelectronic device and bond pads. The photo-resist material is then patterned and developed, as will be understood by those skilled in the art. A chemical etch is then used to removed the developed photo-resist material to form vias therethrough to expose the bond pads. A solder paste is deposited in the vias and reflowed to form the microelectronic interconnects. An etching process is then used to remove the photo-resist material. However, the cleaning and removal processes required in these methods may result in etching damage to the microelectronic device and/or damage to the microelectronic interconnects. Additionally, when an underfill material is used, the etching process may remove a portion of the underfill material which reduces its planarity. Thus, the processes of the present description may have advantage of not requiring etching processes which could cause damage, any surface contamination created during the solder paste deposition and reflow may be removed with the removal of the laser ablation tape, and no damage should occur to the underfill material, if used.

Figure 19:
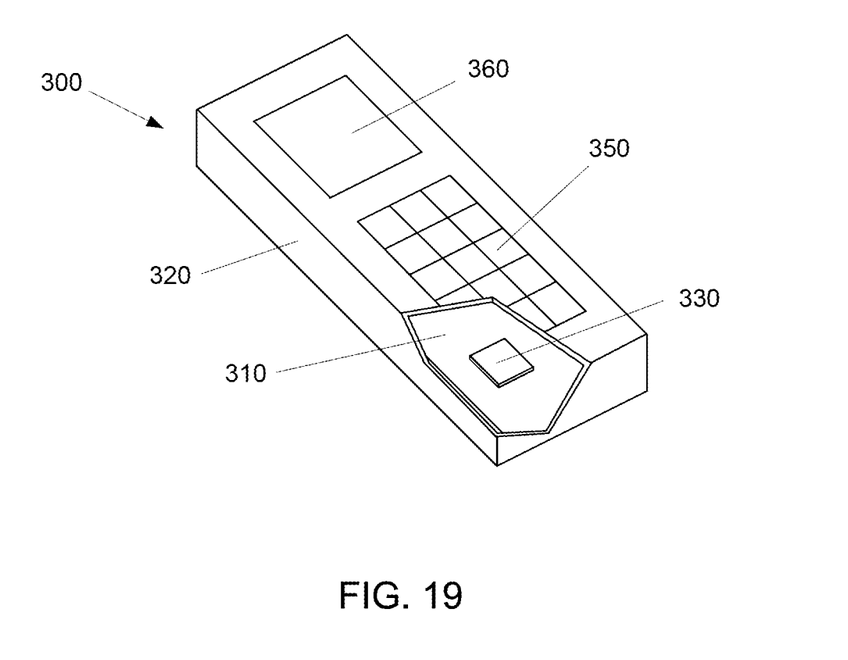
FIG. 19 illustrates an electronic system, according to one embodiment of the present description.

FIG. 19 illustrates an embodiment of an electronic system/device 300, such as a portable computer, a desktop computer, a mobile telephone, a digital camera, a digital music player, a web tablet/pad device, a personal digital assistant, a pager, an instant messaging device, or other devices. The electronic system/device 300 may be adapted to transmit and/or receive information wirelessly, such as through a wireless local area network (WLAN) system, a wireless personal area network (WPAN) system, and/or a cellular network. The electronic system/device 300 may include a microelectronic motherboard or substrate 310 disposed within a device housing 320. The microelectronic motherboard/substrate 310 may have various electronic components electrically coupled thereto, including a microelectronic device 330 having microelectronic interconnects (not shown) formed in the manner described in FIGS. 1-18. The microelectronic motherboard 310 may be attached to various peripheral devices including an input device 350, such as keypad, and a display device 360, such an LCD display. It is understood that the display device 360 may also function as the input device, if the display device 360 is touch sensitive.

It is understood that the subject matter of the present description is not necessarily limited to specific applications illustrated in FIGS. 1-19. The subject matter may be applied to other microelectronic device applications, as well as applications outside of the microelectronic industry, as will be understood by those skilled in the art.

The following examples pertain to further embodiments, wherein Example 1 is a method comprising: providing a microelectronic device having at least one bond pad projecting above an active surface of the microelectronic device, attaching a laser ablation tape to the at least one bond pad, laser ablating at least one via through the laser ablation tape to expose at least a portion of the at least one bond pads, forming a microelectronic interconnect on the at least one bond pad within the at least one via, and removing the laser ablation tape.

In Example 2, the subject matter of Example 1 can optionally include forming the microelectronic interconnect comprising depositing a solder paste within the at least one via, and reflowing the solder paste.

In Example 3, the subject matter of any of Examples 1 to 2 can optionally include attaching the laser ablation tape to the at least one bond pad comprising forming the laser ablation tape by providing a base film and disposing an adhesive layer on the base film; and attaching the laser ablation tape to the at least one bond pad with the adhesive layer.

In Example 4, the subject matter of any of Example 1 to 2 can optionally include attaching a laser ablation tape to the at least one bond pad comprising forming the laser ablation tape by providing a base film, disposing an electrostatic discharge layer on the base film, and disposing an adhesive layer on the static discharge layer, and attaching the laser ablation tape to the at least one bond pad with the adhesive layer.

In Example 5, the subject matter of Example 4 can optionally include disposing the electrostatic discharge layer on the base film comprising disposing a conductive polymer on the base film.

In Example 6, the subject matter of Example 4 can optionally include disposing the electrostatic discharge layer on the base film comprising disposing a conductive metal oxide on the base film.

In Example 7, the subject matter of Example 1 can optionally include attaching a laser ablation tape to the at least one bond pad comprising forming the laser ablation tape by providing a base film and disposing an adhesive layer having a conductive filler disposed therein on the base film; and attaching the laser ablation tape to the at least one bond pad with the adhesive layer.

In Example 8, the subject matter of Example 7 can optionally include disposing the adhesive layer having the conductive filler disposed therein on the base film comprising disposing the adhesive layer having a conductive polymer disposed therein on the base film.

In Example 9, the subject matter of Example 7 can optionally include disposing the adhesive layer having the conductive filler disposed therein on the base film comprising disposing the adhesive layer having the conductive material selected from the group comprising metal coated glass, aluminum doped zinc oxide, nickel-coated graphite, indium tin oxide, silver particles, and tin particles, disposed therein on the base film.

The following examples pertain to further embodiments, wherein Example 10 is a method comprising: providing a microelectronic device having at least one bond pad projecting above an active surface of the microelectronic device, depositing an underfill material over the microelectronic device active surface and the bond pads, removing a portion of the underfill material, to expose an upper surface of the bond pads, while leaving a portion of the underfill material between the bond pads, attaching a laser ablation tape to the at least one bond pad, laser ablating at least one via through the laser ablation tape to expose at least a portion of the at least one bond pads, forming a microelectronic interconnect on the at least one bond pad within the at least one via, and removing the laser ablation tape.

In Example 11, the subject matter of Example 10 can optionally include forming the microelectronic interconnect comprising depositing a solder paste within the at least one via, and reflowing the solder paste.

In Example 12, the subject matter of any of Examples 10 to 11 can optionally include attaching the laser ablation tape to the at least one bond pad comprising forming the laser ablation tape by providing a base film and disposing an adhesive layer on the base film; and attaching the laser ablation tape to the at least one bond pad with the adhesive layer.

In Example 13, the subject matter of any of Example 10 to 11 can optionally include attaching a laser ablation tape to the at least one bond pad comprising forming the laser ablation tape by providing a base film, disposing an electrostatic discharge layer on the base film, and disposing an adhesive layer on the static discharge layer, and attaching the laser ablation tape to the at least one bond pad with the adhesive layer.

In Example 14, the subject matter of Example 13 can optionally include disposing the electrostatic discharge layer on the base film comprising disposing a conductive polymer on the base film.

In Example 15, the subject matter of Example 13 can optionally include disposing the electrostatic discharge layer on the base film comprising disposing a conductive metal oxide on the base film.

In Example 16, the subject matter of Example 10 can optionally include attaching a laser ablation tape to the at least one bond pad comprising forming the laser ablation tape by providing a base film and disposing an adhesive layer having a conductive filler disposed therein on the base film; and attaching the laser ablation tape to the at least one bond pad with the adhesive layer.

In Example 17, the subject matter of Example 16 can optionally include disposing the adhesive layer having the conductive filler disposed therein on the base film comprising disposing the adhesive layer having a conductive polymer disposed therein on the base film.

In Example 18, the subject matter of Example 16 can optionally include disposing the adhesive layer having the conductive filler disposed therein on the base film comprising disposing the adhesive layer having the conductive material selected from the group comprising metal coated glass, aluminum doped zinc oxide, nickel-coated graphite, indium tin oxide, silver particles, and tin particles, disposed therein on the base film.

The following examples pertain to further embodiments, wherein Example 19 is a method comprising: providing a microelectronic device having at least one bond pad projecting above an active surface of the microelectronic device, depositing an underfill material over the microelectronic device active surface and the bond pads, removing a portion of the underfill material, to expose an upper surface of the bond pads, while leaving a portion of the underfill material between the bond pads, attaching a laser ablation tape to the at least one bond pad upper surface and the underfill material, laser ablating at least one via through the laser ablation tape to expose at least a portion of the at least one bond pad upper surface; depositing a solder paste within the at least one via, reflowing the solder paste to form a microelectronic interconnect on the at least one bond pad within the at least one via, and removing the laser ablation tape.

In Example 20, the subject matter of Example 19 can optionally include attaching the laser ablation tape to the at least one bond pad upper surface comprising attaching a laser ablation tape having a mechanism for electrostatic discharge to the at least one bond pad upper surface.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of forming microelectronic devices, the method comprising:
    providing a microelectronic device having at least one bond pad projecting above an active surface of the microelectronic device;
    attaching a laser ablation tape to the at least one bond pad;
    laser ablating at least one via through the laser ablation tape to expose at least a portion of the at least one bond pad;
    forming a microelectronic interconnect on the at least one bond pad within the at least one via; and
    removing the laser ablation tape.

2. The method of claim 1, wherein forming the microelectronic interconnect comprises: depositing a solder paste within the at least one via; and
    reflowing the solder paste.

3. The method of claim 1, wherein attaching the laser ablation tape to the at least one bond pad comprises:
    forming the laser ablation tape by providing a base film and disposing an adhesive layer on the base film; and
    attaching the laser ablation tape to the at least one bond pad with the adhesive layer.

4. The method of claim 1, wherein attaching the laser ablation tape to the at least one bond pad comprises:
    forming the laser ablation tape by providing a base film, disposing an electrostatic discharge layer on the base film, and disposing an adhesive layer on the static discharge layer; and
    attaching the laser ablation tape to the at least one bond pad with the adhesive layer.

5. The method of claim 4, wherein disposing the electrostatic discharge layer on the base film comprises disposing a conductive polymer on the base film.

6. The method of claim 4, wherein disposing the electrostatic discharge layer on the base film comprises disposing a conductive metal oxide on the base film.

7. The method of claim 1, wherein attaching the laser ablation tape to the at least one bond pad comprises:
    forming the laser ablation tape by providing a base film and disposing an adhesive layer having a conductive filler disposed therein on the base film; and
    attaching the laser ablation tape to the at least one bond pad with the adhesive layer.

8. The method of claim 7, wherein disposing the adhesive layer having the conductive filler disposed therein on the base film comprises disposing the adhesive layer having a conductive polymer disposed therein on the base film.

9. The method of claim 7, wherein disposing the adhesive layer having the conductive filler disposed therein on the base film comprises disposing the adhesive layer having the conductive material selected from the group comprising metal coated glass, aluminum doped zinc oxide, nickel-coated graphite, indium tin oxide, silver particles, and tin particles, disposed therein on the base film.

10. A method of forming microelectronic interconnects, the method comprising:
    providing a microelectronic device having at least one bond pad projecting above an active surface of the microelectronic device;
    depositing an underfill material over the microelectronic device active surface and the bond pads;
    removing a portion of the underfill material, to expose an upper surface of the bond pads, while leaving a portion of the underfill material between the bond pads;
    attaching a laser ablation tape to the at least one bond pad upper surface and the underfill material;
    laser ablating at least one via through the laser ablation tape to expose at least a portion of the at least one bond pad upper surface;
    forming a microelectronic interconnect on the at least one bond pad within the at least one via; and
    removing the laser ablation tape.

11. The method of claim 10, wherein forming the microelectronic interconnect comprises: depositing a solder paste within the at least one via; and
    reflowing the solder paste.

12. The method of claim 10, wherein attaching the laser ablation tape to the at least one bond pad comprises:
    forming the laser ablation tape by providing a base film and disposing an adhesive layer on the base film; and
    attaching the laser ablation tape to the at least one bond pad with the adhesive layer.

13. The method of claim 10, wherein attaching the laser ablation tape to the at least one bond pad comprises:

forming the laser ablation tape by providing a base film, disposing a static discharge layer on the base film, and disposing an adhesive layer on the static discharge layer; and attaching the laser ablation tape to the at least one bond pad with the adhesive layer.

14. The method of claim 13, wherein disposing the electrostatic discharge layer on the base film comprises disposing a conductive polymer on the base film.

15. The method of claim 13, wherein disposing the electrostatic discharge layer on the base film comprises disposing a conductive metal oxide on the base film.

16. The method of claim 10, wherein attaching the laser ablation tape to the at least one bond pad comprises:
    forming the laser ablation tape by providing a base film and disposing an adhesive layer having a conductive filled disposed therein on the base film; and
    attaching the laser ablation tape to the at least one bond pad with the adhesive layer.

17. The method of claim 16, wherein disposing the adhesive layer having the conductive filler disposed therein on the base film comprises disposing the adhesive layer having a conductive polymer disposed therein on the base film.

18. The method of claim 16, wherein disposing the adhesive layer having the conductive filler disposed therein on the base film comprises disposing the adhesive layer having the conductive material selected from the group comprising metal coated glass, aluminum doped zinc oxide, nickel-coated graphite, indium tin oxide, silver particles, and tin particles, disposed therein on the base film.

19. A method of forming microelectronic interconnects, the method comprising:
    providing a microelectronic device having at least one bond pad projecting above an active surface of the microelectronic device;
    depositing an underfill material over the microelectronic device active surface and the bond pads;
    removing a portion of the underfill material, to expose an upper surface of the bond pads, while leaving a portion of the underfill material between the bond pads;
    attaching a laser ablation tape to the at least one bond pad upper surface and the underfill material;
    laser ablating at least one via through the laser ablation tape to expose at least a portion of the at least one bond pad upper surface;
    depositing a solder paste within the at least one via;
    reflowing the solder paste to form a microelectronic interconnect on the at least one bond pad within the at least one via; and
    removing the laser ablation tape.

20. The method of claim 19, wherein attaching the laser ablation tape to the at least one bond pad upper surface comprises attaching a laser ablation tape having a mechanism for electrostatic discharge to the at least one bond pad upper surface.

* * * * *